United States Patent [19]

Hatano et al.

[11] Patent Number: 4,553,090
[45] Date of Patent: Nov. 12, 1985

[54] METHOD AND APPARATUS FOR TESTING A LOGIC CIRCUIT USING PARALLEL TO SERIAL AND SERIAL TO PARALLEL CONVERSION

[75] Inventors: Yoshinori Hatano, Tokyo; Kiyoshi Wada, Kawasaki; Ichiro Midorikawa, Tokyo, all of Japan

[73] Assignee: Fujitsu Limited, Kawasaki, Japan

[21] Appl. No.: 171,273

[22] Filed: Jul. 23, 1980

[30] Foreign Application Priority Data

Jul. 26, 1979 [JP] Japan .................................. 54-94198

[51] Int. Cl.$^4$ .......................................... G01R 15/12
[52] U.S. Cl. ................................ 324/73 AT; 364/550; 371/15
[58] Field of Search ........... 324/73 R, 73 AT, 73 PC; 364/550, 551, 580, 579; 371/15, 25, 27

[56] References Cited

U.S. PATENT DOCUMENTS 3,621,387  11/1971  Smith et al. ........................ 324/73 R
3,651,315  3/1972  Collins ............................... 324/73 R
3,832,535  8/1974  DeVito ........................... 324/73 AT

OTHER PUBLICATIONS

Tatah et al., "Level Sensitive Logic Testing", IBM Technical Disclosure Bulletin, vol. 17, No. 12, May 1975, pp. 3680-3681.

Primary Examiner—Gerard R. Strecker
Assistant Examiner—Walter E. Snow
Attorney, Agent, or Firm—Staas & Halsey

[57] ABSTRACT

A system for testing a logic circuit having a plurality of flip-flops associated with a scanning path between scanning-in and scanning-out terminals thereof and a combination circuit including logic gates is disclosed. In the system, parallel input data is transformed to serial data by a shift register, and the serial data is set in the flip-flops, while serial output data is transformed to parallel data by the shift register. The data is then output in parallel.

6 Claims, 14 Drawing Figures

| | CK | SIC | SI | $A_0$ | $A_1$ | ... | $A_m$ | $D_1'$ | $D_2'$ | ... | $D_n'$ | $Q_1'$ | $Q_2'$ | ... | $Q_n'$ |
|---|---|---|---|---|---|---|---|---|---|---|---|---|---|---|---|
| 1 | 0 | — | a | 0 | 0 | | — | — | — | | — | — | — | | — |
| 2 | 0 | — | b | — | 0 | | 0 | — | — | | — | — | — | | — |
| ... | | | | | | | | | | | | | | | |
| n | 0 | — | c | — | — | | — | — | — | | — | — | — | | — |
| n+1 | — | 0 | — | — | — | | — | d | e | | f | — | s | | u |
| n+2 | 0 | 0 | — | 0 | 0 | | 0 | d | e | | f | p | s | | u |
| n+3 | 0 | 0 | — | 0 | 0 | | 0 | d | e | | f | q | s | | u |
| ... | | | | | | | | | | | | | | | |
| 2n+1 | 0 | 0 | — | — | — | | — | d | e | | f | r | s | | u |

Fig. 2 PRIOR ART

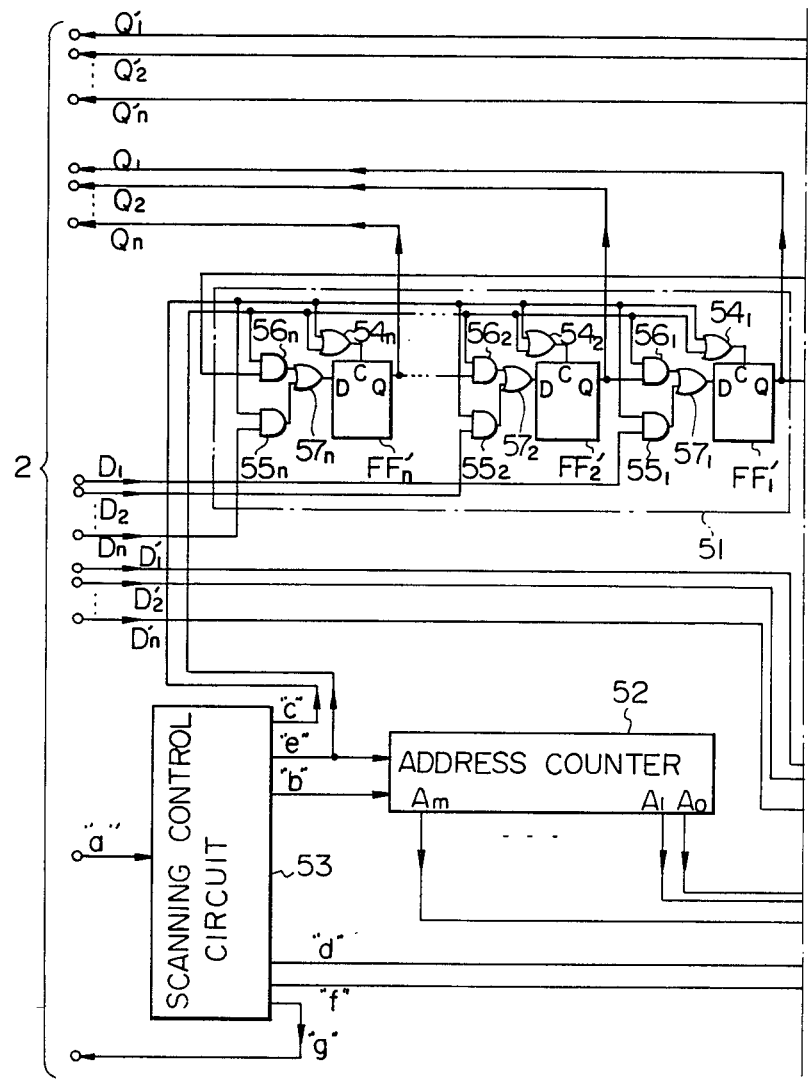

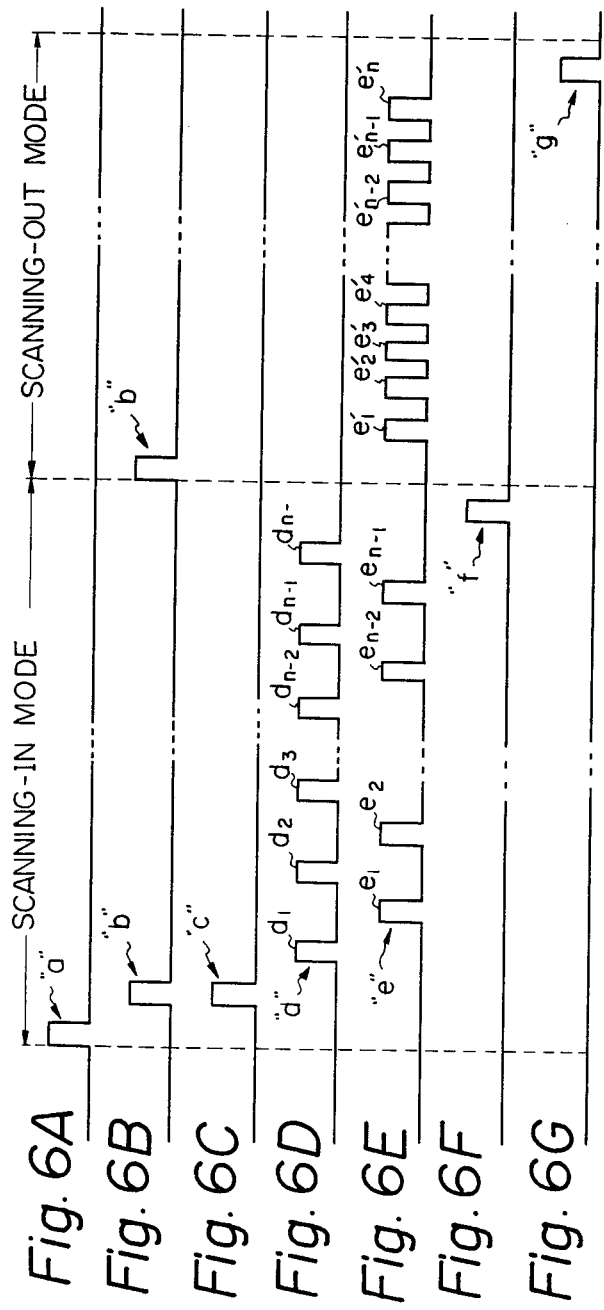

METHOD AND APPARATUS FOR TESTING A LOGIC CIRCUIT USING PARALLEL TO SERIAL AND SERIAL TO PARALLEL CONVERSION

BACKGROUND OF THE INVENTION

The present invention relates to a testing system for a logic circuit and, more particularly, to a method and a device for testing a logic circuit such as a logic LSI (which is an abbreviation for Large Scale Integration) circuit.

In general, a logic LSI circuit comprises a plurality of flip-flops and a combination circuit including AND gates, OR gates, inverters or the like. In recent years, in order to easily execute a test for such a logic circuit, a scanning system has been suggested. In the scanning system, the flip-flops are arranged in parallel so that the flip-flops serve as registers. A signal path, which is called a scanning path, is formed between scanning-in and scanning-out terminals of the circuit. The scanning path is connected to one of the flip-flops by an addressing means. Therefore, the scanning path can be connected to each of the flip-flops in an ordered sequence by the addressing means.

Testing of such a logic circuit is executed separately for the flip-flops and the combination circuit. Among them, testing of the flip-flops is executed by supplying input data from the scanning-in terminal to one of the flip-flops, obtaining output data therefrom at the scanning-out terminal and checking whether or not the output data is the same as the input data. This is a simple operation. In contrast, testing of the combination circuit is a complex operation.

In the prior art, the combination of a logic circuit is tested by using the flip-flops thereof which have already been tested. First, input test data is set in sequence in the flip-flops of the logic circuit by a testing device. After that, the combination circuit executes a logic operation upon the data stored in the flip-flops and the result thereof is again stored in the flip-flops. Next, the results are provided as output data, in sequence, from the flip-flops to the testing device. After that, in the testing device, the output data is compared with predetermined data and testing of the combination circuit is completed.

However, in the above-mentioned prior art system, in order to set the input data in the flip-flops, a large number of input test patterns, each of which includes an address code designating one of the flip-flops, input data, a clock code or the like, are required. Similarly, in order to obtain the operation result from the flip-flops, a large number of output test patterns, each of which also include an address code designating one of the flip-flops, output data, and a clock code or the like, are required. In this case, the number of input test patterns or output test patterns are the same as the number of flip-flops. As a result, the capacity of memory devices, such as magnetic tapes, for storing the test patterns must be large. In addition, the number of transmissions of test patterns between the testing device and the logic circuit must be large, so that the test executing time becomes long.

SUMMARY OF THE INVENTION

It is a principal object of the present invention to provide a system, for testing a logic circuit, with memory devices having a small capacity for storing test patterns and with a short test executing time.

According to the present invention, there is provided a method for testing a logic circuit having a plurality of flip-flops associated with a scanning path between scanning-in and scanning-out terminals thereof and a combination circuit including logic gates, the method comprising the steps of: transforming parallel input data to serial input data; setting the serial input data in each selected one of the flip-flops; performing a logic operation upon the input data stored in the flip-flops by using the combination circuit; storing output data resulting from the logic operation in the flip-flops; and outputting the output data in parallel.

According to the present invention, there is also provided a device for testing a logic circuit having a plurality of first flip-flops associated with a scanning path between scanning-in and scanning-out terminals thereof and a combination circuit including logic gates, the device comprising: an addressing means for selecting one of the first flip-flops; a single shift register, connected to the scanning-in and scanning-out terminals, for receiving input data in parallel and for, in turn, transmitting the input data bits in series to each selected one of the first flip-flops through the scanning-in terminal, and for receiving output data resulting from the operation of the combination circuit stored in each selected one of the first flip-flops through the scanning-out terminal and for, in turn, outputting the output data in parallel.

The present invention will be more clearly understood from the description set forth below with reference to the accompanying drawings, wherein like numerals refer to like parts throughout.

BRIEF DESCRIPTION OF THE DRAWINGS

FIG. 2 is a diagram showing test patterns used in the system of FIG. 1;

FIGS. 6A through 6G are timing diagrams of the signals "a" through "g", respectively, appearing in the circuit of FIG. 5.

DETAILED DESCRIPTION OF THE PREFERRED EMBODIMENT

Figure 1:
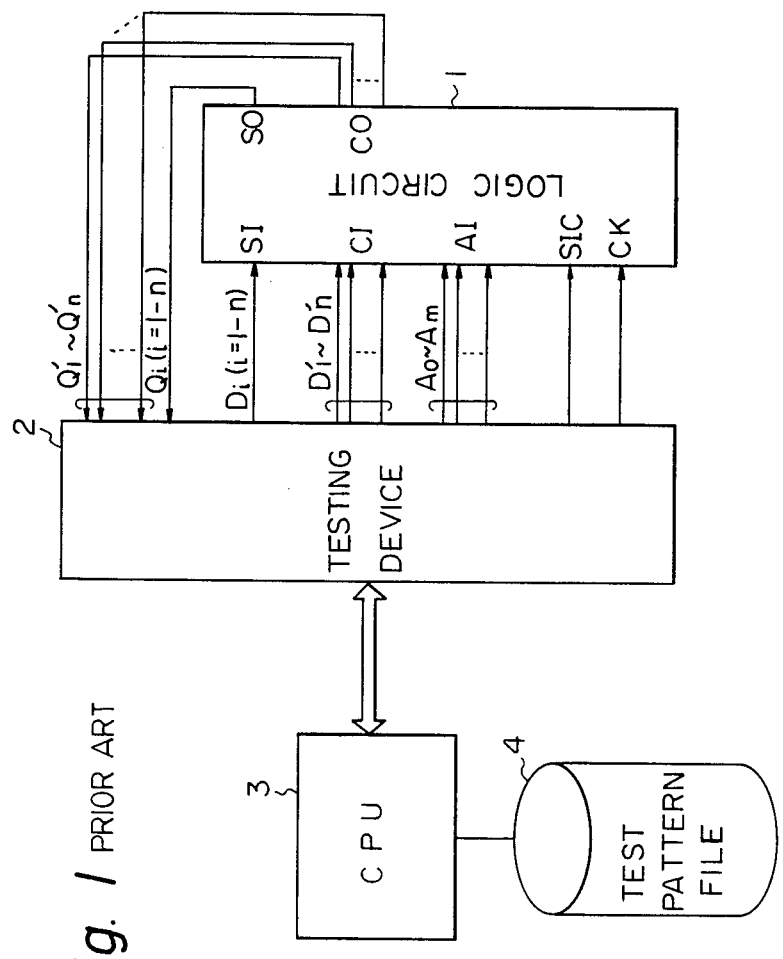
FIG. 1 is a block diagram of one conventional testing system for a logic circuit.

Referring to FIG. 1, which illustrates one conventional testing device for a logic circuit, a logic circuit 1 is tested by a testing device 2 which is controlled by a central processing unit (hereinafter referred to as a CPU) 3. The CPU 3 is associated with a test pattern file 4, which is used for testing the logic circuit 1 and is, for example, formed by magnetic tapes.

The logic circuit 1 comprises n flip-flops (not shown) which serve as registers during a test mode and a combination circuit (not shown) including AND gates, OR gates, inverters or the like. In addition, the logic circuit 1 comprises a scanning-in terminal SI for inputting data $D_i(i=1, 2, \ldots, n)$ into i-th flip-flops, circuit input terminals CI for inputting constant data bits $D_1'$ through $D_n'$ into the combination circuit, address input terminals AI for inputting address signals $A_o$ through $A_m$ so as to select one of the flip-flops, a scanning-in clock terminal SIC for inputting a timing clock for an input operation of the data $D_i$, a clock terminal CK for inputting a timing clock for setting a logic operation result of the combination circuit in parallel in the flip-flops, a scanning-out terminal SO for outputting the operation results stored in the flip-flops, and circuit output terminals CO for outputting constant data bits $Q_1'$ through $Q_n'$.

In order to execute a test for the logic circuit 1, one of the input data bits $D_1$ through $D_n$ is set in each of the flip-flops $FF_1$, $FF_2$, ..., $FF_n$ thereof, respectively. For example, when the input data bit $D_1$ is set in the first flip-flop, the testing device 2 generates address signals $A_o$ through $A_m$, each of which indicates "0", so as to select the first flip-flop and, simultaneously, generates a scanning-in clock signal to the terminal SIC. In contrast, when the data bit $Q_1$ stored in the first flip-flop is output from the circuit 1, the testing device 2 generates address signals $A_o$ through $A_m$, each of which also indicates "0", so as to select the first flip-flop. The data comprising the signals transmitted from the testing device 2 are formed in advance in the test pattern file 4. That is, the CPU 3 searches test patterns stored in the file 4 and transmits the patterns to the testing device 2. The test patterns will now be explained.

FIG. 2 is a diagram showing test patterns used in the system of FIG. 1. In FIG. 2, each of the test patterns is comprised of data used for the input terminals CK, SIC, SI, AI and CI and the output terminals SO and CO. The notations "a", "b", ..., "f" indicate input data bits having values of "0" or "1", while "p", "q", ..., "u" indicate output data bits having values of "0" or "1". The notation "—" indicates input data bits or output data bits having a value which is, however, meaningless. If the logic circuit 1 has n flip-flops, (2n+1) test patterns are required, resulting in a large test pattern file storage capacity being required. Among the test patterns, the first through n-th test patterns are used for a scanning-in operation in which an input data bit is set in each of the flip-flops. In addition, the (n+1)th test pattern is used for transmitting the logic operation result of the combination circuit to the flip-flops. Further, the (n+2)th through (2n+1)th test patterns are used for a scanning-out operation in which the data bit stored in each of the flip-flops is output. Therefore, there are (2n+1) transmissions of test patterns between the logic circuit 1 and the testing device 2, resulting in a long test executing time.

In the present invention, only one test pattern is prepared, so that the storage capacity of the test pattern file is reduced as compared with that of the conventional system. In addition, parallel input data of the test pattern is stored in a shift register, in parallel, which is newly provided between the logic circuit 1 and the testing device 2, and after that, each input data bit is transmitted sequentially from the shift register to the logic circuit. In contrast, serial output data of from the logic circuit is transmitted sequentially to the shift register and after that, the data stored in the shift register is transmitted in parallel from the shift register to the testing device. Therefore, there are a small number of transmissions between the testing device 2 and the newly provided shift register (or the logic circuit 1), so that the speed of the test executing time becomes high compared with that of the conventional system. It should be noted that, the speed of the shift operation of the shift register is much higher than speed the transmission of the test patterns.

Figure 3:
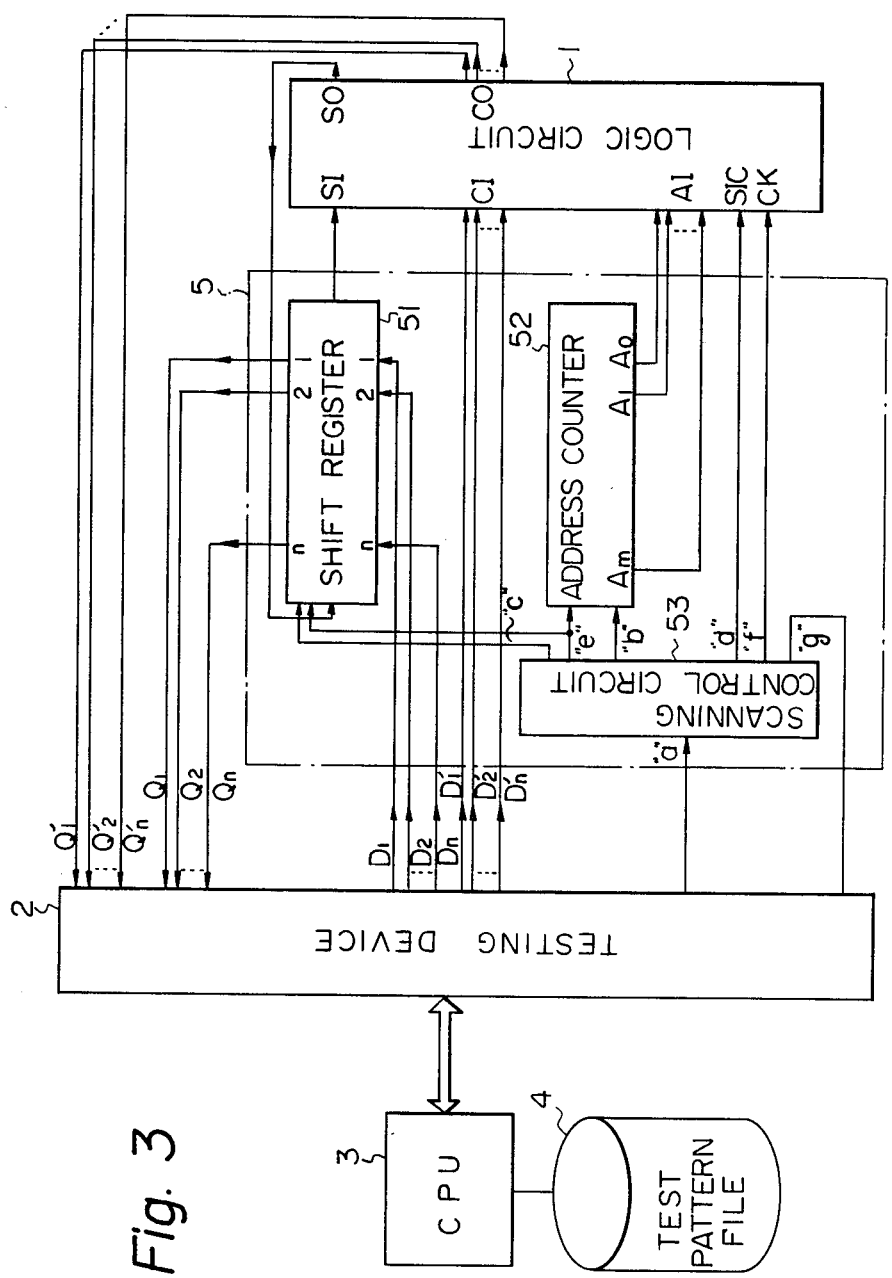
FIG. 3 is a block diagram of an embodiment of the testing system for a logic circuit according to the present invention.

FIG. 3 is a block diagram illustrating an embodiment of the testing system for a logic circuit according to the present invention. In FIG. 3, the elements which are identical to those of FIG. 1 are denoted by the same references. In FIG. 3, another testing device 5, which is comprised of a shift register 51, an address counter 52 and a scanning control circuit 53, is provided, in addition to the system of FIG. 1. In the shift register 51, the data $D_1$, $D_2$, ..., $D_n$ is set therein in parallel, while data $Q_1$, $Q_2$, ..., $Q_n$ is output therefrom in parallel. Therefore, there are only two transmissions of a test pattern between the testing device 2 and the additional testing device 5, so that the test executing time becomes short. The address counter 52 selects one of the flip-flops (not shown) of the logic circuit 1. Both the shift register 51 and the address counter 52 are controlled by the scanning control circuit 53.

Figure 4:
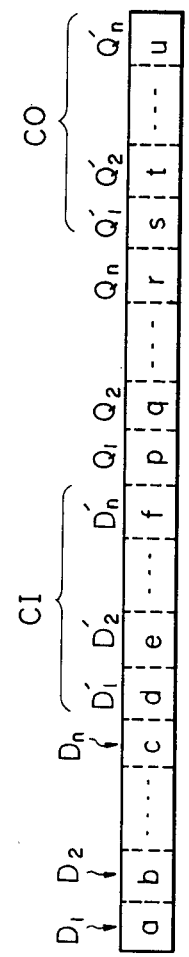
FIG. 4 is a diagram showing a test pattern used in the system of FIG. 3.

FIG. 4 is a diagram showing a test pattern used in the system of FIG. 3. As illustrated in FIG. 4, the test pattern is comprised of input data bits $D_1$, $D_2$, ..., $D_n$, constant input data bits $D_1'$, $D_2'$ ..., $D_n'$, output data bits $Q_1$, $Q_2$, ..., $Q_n$ and constant output data bits $Q_1'$, $Q_2'$, ..., $Q_n'$. That is, the address data $A_0$, $A_1$, ..., $A_m$ of FIG. 2 is not present in FIG. 4, since the address counter 52 generates such the address data. In addition, the data used for the terminals CK and SIC is also not present in FIG. 4, since the scanning control circuit 53 generates such this data. Thus, the number of test patterns prepared for a logic test is small.

Figure 5B:
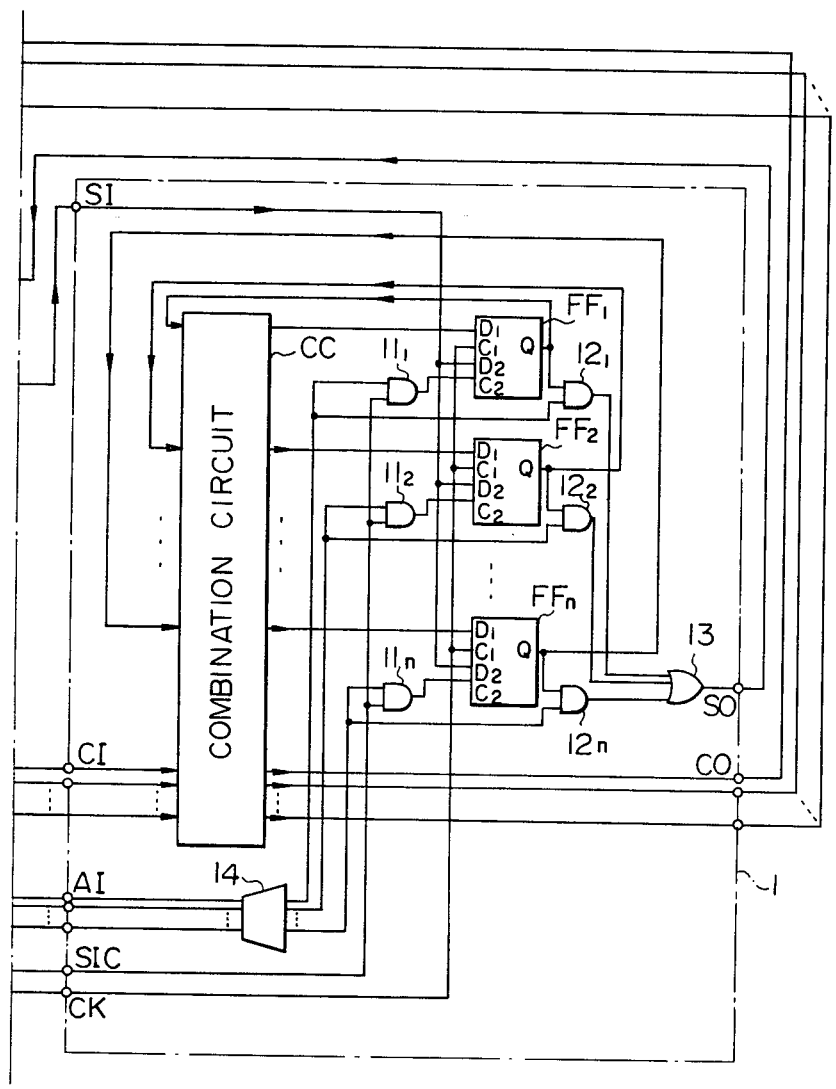
FIG. 5 (including FIGS. 5A and 5B) is a detailed circuit diagram of the logic circuit 1 and the testing device 5 of FIG. 3.

FIG. 5 is a detailed circuit diagram of the logic circuit 1 and the additional testing device 5 of FIG. 3. In FIG. 5, the logic circuit 1 comprises flip-flops $FF_1$, $FF_2$, ..., $FF_n$ and a combination circuit CC including other logic gates, such as AND gates, OR gates, inverters or the like. The flip-flops $FF_1$, $FF_2$, ..., $FF_n$ are provided with AND gates $11_1$, $11_2$, ..., $11_n$, respectively, and AND gates $12_1$, $12_2$, ..., $12_n$, respectively, which are connected to an OR gate 13. The shift register 51 comprises flip-flops $FF_1'$, $FF_2'$, ..., $FF_n'$ whose number is the same as the flip-flops $FF_1$, $FF_2$, ..., $FF_n$ of the logic circuit 1. Each of the flip-flops $FF_i'$ (i=1, 2, ..., n) is provided with an OR gate $54_i$ connected to a clock terminal thereof, an AND gate $55_i$ for inputting data $D_i$ thereto, an AND gate $56_i$ for a shift operation mode and an OR gate $57_i$ connected to the outputs of the AND gates $55_i$ and $56_i$.

The operation of the circuit of FIG. 5 will now be explained.

FIGS. 6A through 6G are timing diagrams of the signal "a" through "g" appearing in the circuit of FIG. 5. Referring to FIGS. 6A through 6G, the scanning control circuit 53 receives a scanning start signal "a", as illustrated in FIG. 6A, from the testing device 2 and, in turn, generates the following signals sequentially:

a clear signal "b" for clearing the address counter 52;

a parallel input indicating signal "c" for inputting input data bits $D_1$, $D_2$, ..., $D_n$ in parallel to the shift register 51;

a scanning-in clock signal "d" for setting the data but stored in the high order flip-flop $FF_1'$ in a selected flip-flop of the logic circuit 1;

a shifting/counting signal "e" for shifting the shift register 51 and, simultaneously, advancing the address counter 52;

a clock signal "f" for setting the operation results of the combination circuit CC in all the flip-flops $FF_1$, $FF_2$, ..., $FF_n$ at once and a scanning end signal "g" for indicating an end of the scanning-in and scanning-out operation.

The scanning-in operation in which each of the data bits $D_1, D_2, \ldots, D_n$ is set in the flip-flops $FF_1, FF_2, \ldots, FF_n$ of the logic circuit 1, respectively, is carried out as follows. The scanning control circuit 53 generates a clear signal "b", as illustrated in FIG. 6B, so as to clear the address counter 52 and, simultaneously, generates a parallel input signal "c", as illustrated in FIG. 6C, to all the OR gates $54_1, 54_2, \ldots, 54_n$ and the AND gates $55_1, 55_2, \ldots, 55_n$ and accordingly, the data $D_1, D_2, \ldots, D_n$ is set in the flip-flops $FF_1', FF_2', \ldots, FF_n'$ in parallel.

Next, the scanning control circuit 53 generates a first pulse $d_1$ of a scanning-in clock signal "d", as illustrated in FIG. 6D, to all the AND gates $11_1, 11_2, \ldots, 11_n$. In this case, the AND gate $11_1$ is selected by the decoder 14, since the address data $A_0, A_1, \ldots, A_m$ of the address counter 52 indicates "0". Therefore, the data bit $D_1$ stored in the flip-flop $FF_1'$ is transmitted to the flip-flop $FF_1$ of the logic circuit 1. After that, the scanning control circuit 53 generates a first pulse $e_1$ of a shifting-/counting signal "e", as illustrated in FIG. 6E, to all the OR gates $54_1, 54_2, \ldots, 54_n$ and the AND gates $56_1, 56_2, \ldots, 56_n$. Consequently, the data $D_2, D_3, \ldots, D_n$ stored in the flip-flops $FF_2', FF_3', \ldots, FF_n'$ is transmitted to the flip-flops $FF_1', FF_2', \ldots, FF_{n-1}'$, respectively, and in addition, the data stored in the flip-flop $FF_1$ of the logic circuit 1 is transmitted to the flip-flop $FF_n'$. Simultaneously, the address counter 52 is advanced, so that the address data $A_0, A_1, \ldots, A_m$ becomes "1, 0, ..., 0" (=2) and, accordingly, the flip-flop $FF_2$ of the logic circuit 1 is selected by the decoder 15.

Next, the scanning control circuit 53 generates a second pulse $d_2$ of the scanning-in clock signal "d" and the data bit $D_2$ stored in the flip-flop $FF_1'$ is transmitted to the flip-flop $FF_2$ of the logic circuit 1. After that, the scanning control circuit 53 generates a second pulse $e_2$ of the shifting/counting signal "e", so that the data bits $D_3, D_4, \ldots, D_n$ stored in the flip-flops $FF_2', FF_3', \ldots, FF_{n-1}'$ is transmitted to the flip-flops $FF_1', FF_2', \ldots, FF_{n-2}'$, respectively, and in addition, the data stored in the flip-flop $FF_2$ of the logic circuit 1 is transmitted to the flip-flop $FF_n'$. Simultaneously, the address counter 52 is advanced. Thus, after the scanning control circuit 53 has generated all the pulses $d_1, d_2, \ldots, d_n; e_1, e_2, \ldots, e_{n-1}$, all the data $D_1, D_2, \ldots, D_n$ is respectively set in the flip-flops $FF_1, FF_2, \ldots, FF_n$, of the logic circuit 1.

For such this data $D_1, D_2, \ldots, D_n$, respectively, stored in the flip-flops $FF_1, FF_2, \ldots, FF_n$, the logic operation is executed by the combination circuit CC. After that, the scanning control circuit 53 generates a clock signal "f", as illustrated in FIG. 6F, so that the operation results $Q_1, Q_2, \ldots, Q_n$ of the combination circuit CC are respectively set in parallel in each of the flip-flops $FF_1, FF_2, \ldots, FF_n$.

The scanning-out operation in which the operation results $Q_1, Q_2, \ldots, Q_n$ stored in the flip-flops $FF_1, FF_2, \ldots, FF_n$ of the logic circuit 1 are transmitted to the testing device 2 will now be explained. In the scanning-out mode, the scanning control circuit 53 generates a clear signal "b" as illustrated in FIG. 6B, so that the address counter 52 is cleared and the flip-flop $FF_1$ is selected by the decoder 14. Next, the scanning control circuit 53 generates a pulse $e_1'$ of the shifting/counting signal "e", as illustrated in FIG. 6E, and the data bit $Q_1$ stored in the flip-flop $FF_1$ is transmitted through the AND gate $12_1$ and the OR gate 13 to the flip-flop $FF_n'$. Simultaneously, the address counter 52 is advanced, so that the flip-flop $FF_2$ is selected by the decoder 14. Similarly, the scanning control circuit 53 generates a pulse $e_2'$, the data $Q_1$ stored in the flip-flop $FF_n'$ is transmitted to the flip-flop $FF_{n-1}'$ and the data stored in the flip-flop $FF_2$ of the logic circuit 1 is transmitted to the flip-flop $FF_n'$. Thus, after the scanning control circuit 53 has generated all the pulses $e_1', e_2', \ldots, e_n'$, all the operation results $Q_1, Q_2, \ldots, Q_n$ are respectively set in the flip-flops $FF_1', FF_2', \ldots, FF_n'$, of the single shift register 51.

Next, the scanning control circuit 53 generates a scanning end signal "g", as illustrated in FIG. 6G, to the testing device 2, and the testing device 2 receives the operation results $Q_1, Q_2, \ldots, Q_n$ stored in parallel in the flip-flops $FF_1', FF_2', \ldots, FF_n'$. As a result, one test for the logic circuit 1 is completed.

In FIGS. 3 and 5, the additional testing device 5 according to the present invention is provided between the testing device 2 and the logic circuit 1. However, it should be noted that the additional testing device 5 can be incorporated in the testing device 2.

As explained hereinbefore, the testing system according to the present invention has the following advantages as compared with those of the conventional system.

(1) The capacity of the test pattern file 4 is reduced, since only a small number of test patterns are necessary.

(2) The test executing time is reduced, since there are only a small number of transmissions of test patterns between the testing device 2 and the logic circuit 1.

We claim:

1. A method for testing a logic circuit having scanning-in and scanning-out terminals, having a plurality of flip-flops associated with a scanning path between the scanning-in and scanning-out terminals, and having a combination circuit including logic gates, said method comprising the steps of:
   receiving parallel input data;
   transforming the parallel input data to serial input data by a single shift register;
   selectively setting the serial input data in each of the flip-flops;
   performing a logic operation upon the input data set in the flip-flops by using the combination circuit and providing, as a result, output data;
   storing the output data resulting from the logic operation in the flip-flops; and
   outputting the output data in parallel from the single shift register.

2. A device for testing a logic circuit, operatively connected to receive input data, having a scanning-in terminal and a scanning-out terminal, having a plurality of first flip-flops associated with a scanning path between the scanning-in and scanning-out terminals, and having a combination circuit including logic gates for performing a logic operation and for providing output data to the first flip-flops, said device comprising:
   means for providing the input data in parallel;
   addressing means, operatively connected to th first flip-flops, for supplying an address to sequentially select each of the first flip-flops so as to output the output data provided to the first flip-flops;
   a single shift register, connected to said scanning-in and scanning-out terminals, the first flip-flops and said means for providing the parallel input data, for receiving the parallel input data and for, in turn, transmitting the input data in series to each selected one of the first flip-flops through the scanning-in terminal, and for receiving the output data, resulting from the logic operation of the combination circuit, stored in each selected one of the first flip-flops, through the scanning-out terminal and for, in turn, outputting the output data in parallel.

3. A device as set forth in claim 2, wherein said single shift register comprises a plurality of second flip-flops, connected in series, and wherein the number of said second flip-flops is the same as the number of the first flip-flops of said logic circuit.

4. A device as set forth in claim 3, further comprising:
means for controlling said addressing means and said single shift register, said controlling means for generating:
a clear signal for clearing said addressing means;
a parallel input indicating signal for inputting said parallel data to said single shift register;
a scanning-in clock signal for transmitting one of the input data bits stored in a high order one of said second flip-flops to a selected one of the first flip-flops;
a shifting/counting signal for shifting said shift register and advancing said addressing means;
a clock signal for setting the operation result of the combination circuit in the first flip-flops in parallel; and
a scanning end signal for indicating an end of test operation.

5. A device for testing a logic circuit, operatively connected to receive input data, having a scanning-in terminal and a scanning-out terminal, having logic flip-flops operatively connected between the scanning-in and scanning-out terminals, and having a combination circuit, operatively connected to the logic flip-flops, including logic gates for performing a logic operation and for providing output data to the logic flip-flops, said device comprising:

means for providing the input data in parallel;
means for providing a scanning start signal;
a scanning control circuit, operatively connected to said means for providing a scanning start signal, for receiving the scanning start signal and for generating a clear signal, a parallel input indicating signal, a scanning-in clock signal, a shifting/counting signal, a clock signal, and a scanning end signal;
an address counter operatively connected to said scanning control circuit and to the logic circuit, said address counter clearing upon receipt of said clear signal, said address counter advancing upon receipt of said shifting/counting signal, and said address counter providing, as an output, an address signal to the logic circuit for sequentially selecting each of the logic flip-flops; and
a single shift register operatively connected to said means for providing said parallel input data, the logic flip-flops, said scanning control circuit and the scanning-in and scanning-out terminals, said single shift register reading in said parallel input data in response to said parallel input indicating signal, said single shift register shifting said input data in response to said shifting/counting signal, said single shift register transmitting said input data in series, to the selected one of the logic flip-flops selected by said address counter, through said scanning-in terminal, said single shift register receiving the output data, resulting from the logical operation of the combination circuit which is stored in each of the selected logic flip-flops, through the scanning-out terminal, said single shift register for providing, as an output, the output data in parallel.

6. A device as set forth in claim 5, wherein said single shift register comprises shift flip-flops and wherein the number of shift flip-flops is equal to the number of logic flip-flops.

* * * * *